United States Patent
Sato

(10) Patent No.: US 10,093,094 B2
(45) Date of Patent: Oct. 9, 2018

(54) JOINT STRUCTURE, PIEZOELECTRIC DEVICE, LIQUID EJECTING HEAD, LIQUID EJECTING APPARATUS, AND MANUFACTURING METHOD OF JOINT STRUCTURE

(71) Applicant: SEIKO EPSON CORPORATION, Tokyo (JP)

(72) Inventor: Naoya Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/664,860

(22) Filed: Jul. 31, 2017

(65) Prior Publication Data

US 2018/0056655 A1 Mar. 1, 2018

(30) Foreign Application Priority Data

Aug. 31, 2016 (JP) .................. 2016-168865

(51) Int. Cl.
*B41J 2/14* (2006.01)
*H01L 41/083* (2006.01)
*B41J 2/16* (2006.01)

(52) U.S. Cl.
CPC ....... *B41J 2/14201* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1632* (2013.01); *H01L 41/083* (2013.01); *B41J 2002/14491* (2013.01); *H01L 2224/73204* (2013.01)

(58) Field of Classification Search
CPC .................................................. B41J 2/14201
See application file for complete search history.

(56) References Cited

U.S. PATENT DOCUMENTS

| 7,830,007 | B2 | 11/2010 | Tanaka et al. |
| 2009/0032944 | A1 | 2/2009 | Tanaka et al. |
| 2017/0028726 | A1 | 2/2017 | Sato et al. |
| 2017/0157930 | A1* | 6/2017 | Hashiguchi ............... B41J 2/14 |

FOREIGN PATENT DOCUMENTS

| JP | 2009-260389 A | 11/2009 |
| JP | 2017-024281 A | 2/2017 |
| JP | 2017-024372 A | 2/2017 |

\* cited by examiner

*Primary Examiner* — Bradley Thies
(74) *Attorney, Agent, or Firm* — Workman Nydegger

(57) ABSTRACT

A joint structure includes a first substrate in which a resin portion which protrudes from one face and is formed of a resin, and a first electrode which covers a part of the resin portion are formed, and a second substrate on which a second electrode corresponding to the first electrode is formed are joined in a state in which the first electrode and the second electrode are electrically connected, in which a region in which the resin portion is disposed on one face of the first substrate includes a first region in which the resin portion is in contact with the one face, and a second region in which the resin portion is separated from the one face, and the second region is formed in the outside of the first region in the inside of the one face.

8 Claims, 13 Drawing Sheets

FIG. 18
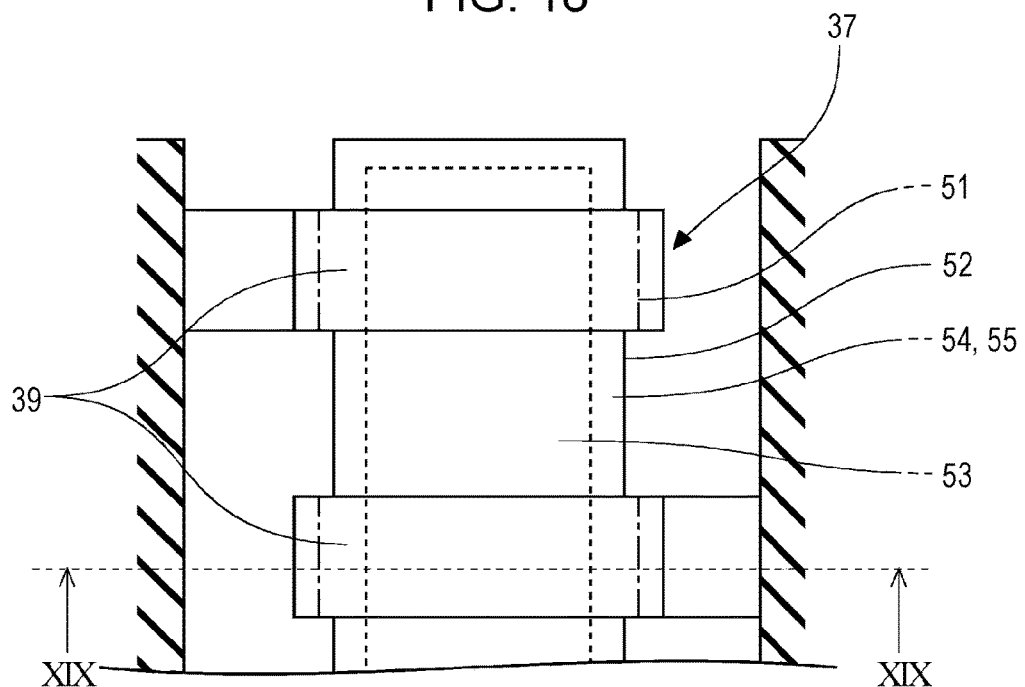
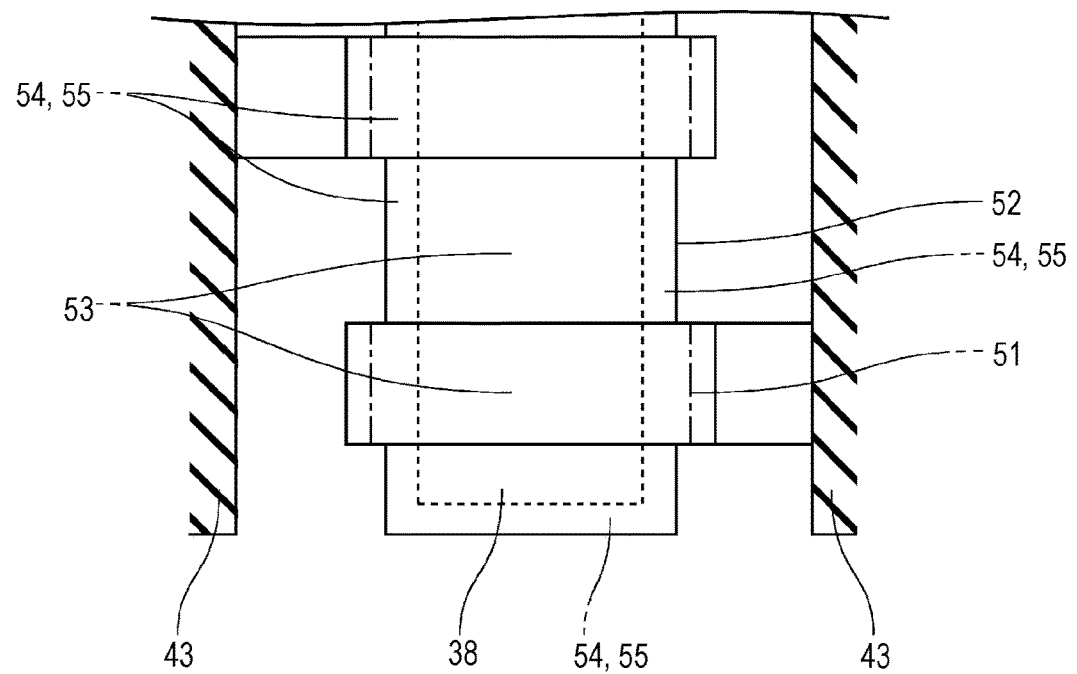

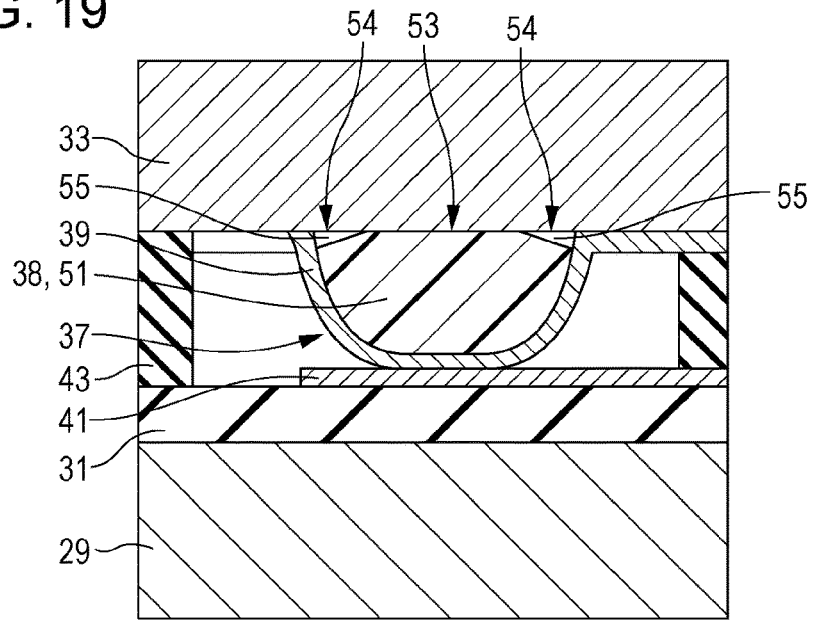
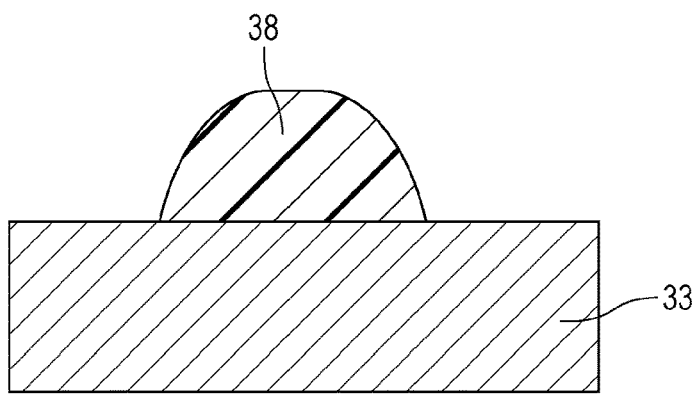
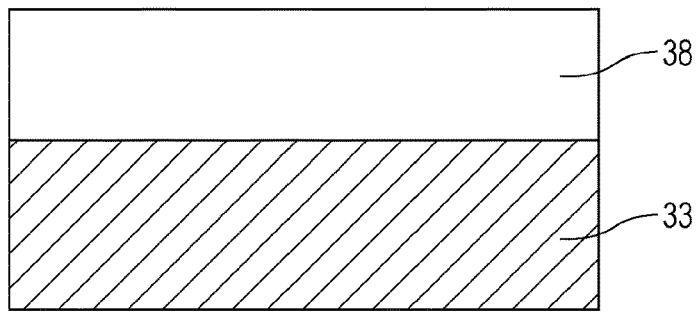

JOINT STRUCTURE, PIEZOELECTRIC DEVICE, LIQUID EJECTING HEAD, LIQUID EJECTING APPARATUS, AND MANUFACTURING METHOD OF JOINT STRUCTURE

BACKGROUND

1. Technical Field

The present invention relates to a joint structure provided with a resin portion and an electrode which covers the resin portion, a piezoelectric device, a liquid ejecting head, a liquid ejecting apparatus, and a manufacturing method of the joint structure.

2. Related Art

A joint structure formed by joining two substrates is embedded in various electronic devices. For example, a liquid ejecting head mounted on a liquid ejecting apparatus such as an ink jet printer, or an ink jet plotter includes a joint structure in which one substrate on which an actuator such as a piezoelectric element is provided, and the other substrate which faces the one substrate are joined. As a joint structure which is used in the liquid ejecting head, there is a joint structure in which wiring is formed on the surface of one substrate, and the surface of the other substrate. In addition, wiring in the one substrate and wiring in the other substrate are connected through a bump electrode.

Here, as the above described bump electrode, there is a bump electrode including a series of resin layers formed on a substrate, and an electrode (wiring) formed on the surface of the resin layer (for example, JP-A-2009-260389). In addition, in a portion in the resin layer corresponding to a portion between electrodes adjacent to each other (that is, between bump electrodes), a part of the surface is shaved using etching, and becomes small. That is, a height of the resin layer between adjacent electrodes (dimension from substrate to top face of resin layer) is formed to be lower than a height of a resin layer located just below the electrode (in short, resin layer in portion covered with electrode) (refer to JP-A-2009-260389).

However, in the above described configuration, there is a concern that residue may remain on the substrate when etching the resin layer between electrodes. This point will be described in detail with reference to a configuration of a bump electrode 91 in the related art illustrated in FIG. 28. As illustrated in FIG. 28, the bump electrode 91 in the related art is provided with a resin portion 92 which protrudes onto a substrate 90, and an electrode 93 stacked on the surface of the resin portion. It is possible to configure such an electrode 93 using the same material as that of wiring 94 on the substrate 90. For example, it is possible to set the wiring 94 on the substrate 90 to the electrode 93 by extending the wiring to a portion which overlaps with the resin. In addition, as illustrated in FIG. 28, a plurality of the electrodes 93 are disposed on the resin portion 92 with intervals. A height of the resin portion 92 from the surface of the substrate 90 between the electrodes 93 is set to be lower than a height of the resin portion 92 from the surface of the substrate 90 which is located just below the electrode 93. In addition, as a forming method of such a resin portion 92, a method of removing a part of the resin portion 92 between the electrodes 93 using etching (specifically, dry etching) the resin portion 92 using the electrode 93 as a mask is adopted. However, when forming the resin portion 92 using such a method, there has been a concern that residue 95 may remain in a region in which the resin portion 92 is removed from the surface of the substrate 90. That is, there has been a concern that the residue 95 may remain on the substrate 90 between the electrodes 93. When the residue 95 remains, a short circuit between the electrodes 93 due to migration easily occurs. As a result, there has been a concern that reliability of a joint structure with such a structure may decrease.

SUMMARY

An advantage of some aspects of the invention is to provide a joint structure, a piezoelectric device, a liquid ejecting head, a liquid ejecting apparatus of which a decrease in reliability is suppressed, and a manufacturing method of the joint structure.

According to an aspect of the invention, there is provided a joint structure which includes a first substrate on which a resin portion which protrudes from one face, and is formed of a resin, and a plurality of first electrodes which cover a part of the surface on the side opposite to the one face of the resin portion are formed; and a second substrate on which a plurality of the second electrodes corresponding to the plurality of first, in which electrodes are formed on the face which faces the one face, in which the first substrate and the second substrate are joined in a state in which the first electrode and the second electrode corresponding to each other are electrically connected, and in which a region in which the resin portion is disposed on the one face of the first substrate includes a first region in which the resin portion is in contact with the one face, and a second region in which the resin portion is separated from the one face, and the second region is formed on the outer side of the first region in the one face.

According to the configuration, since the portion on the outer side of the resin portion is separated from the first substrate, it is possible to prevent residue from remaining on the first substrate, even when the resin portion between the first electrodes is set to be small using etching. In this manner, it is possible to suppress migration between the first electrodes due to residue. As a result, it is possible to suppress a decrease in insulation reliability between the first electrodes, and a decrease in reliability of the joint structure. In addition, a path between a first electrode and a first electrode which is adjacent thereto through the surface of the resin portion becomes long on one face of the first substrate, and it is possible to suppress migration through the resin portion.

In the aspect, it is preferable that the resin portion include a first portion which is covered with the first electrode, and a second portion adjacent to the first potion, and a height of the first portion from the one face be higher than a height of the second portion from the one face.

According to the configuration, a path between a first electrode and a first electrode adjacent thereto through the surface of the resin portion becomes long, and it is possible to suppress migration through the resin portion. In addition, it is possible to reduce pressure added to both substrates when joining the first electrode and the second electrode. It is possible to make an elastic restoring force of the resin portion small in a state in which the first electrode and the second electrode are joined. As a result, it is possible to suppress damage, or the like, of the substrate.

In the aspect, it is preferable that the resin portion include the first portion covered with the first electrode, and the second portion adjacent to the first portion, and a distance between the first portion and the second electrode be shorter than a distance between the second portion and the second electrode in a direction intersecting the one face.

According to the configuration, it is possible to prevent a portion other than the first electrode from coming into contact with the second electrode. That is, it is possible to reliably connect the first electrode and the second electrode.

In any one of each of the aspects, it is preferable that the second region be formed in a region corresponding to a portion between the two first electrodes.

According to the configuration, it is possible to further reliably suppress migration between the first electrodes.

In any one of each of the aspects, it is preferable to form the second region at the periphery of the first region.

According to the configuration, it is possible to further prevent residue from remaining on the first substrate using etching of the resin portion, and further suppress migration between the first electrodes.

According to another aspect of the invention, there is provided a piezoelectric device which includes the joint structure according to any one of each of the aspects, and a piezoelectric element stacked on any one of a first substrate and a second substrate.

According to the configuration, it is possible to suppress a decrease in reliability of the piezoelectric device.

According to still another aspect of the invention, there is provided a liquid ejecting head which includes the piezoelectric device in the aspect, and nozzles from which liquid is ejected when the piezoelectric element is driven.

According to the configuration, it is possible to suppress a decrease in reliability of the liquid ejecting head.

According to still further another aspect, there is provided a liquid ejecting apparatus which includes the liquid ejecting head in the aspect.

According to the configuration, it is possible to suppress a decrease in reliability of the liquid ejecting apparatus.

According to still another aspect of the invention, there is provided a manufacturing method of a joint structure which includes a first substrate on which a resin portion which protrudes from one face, and is formed of a resin, and a plurality of first electrodes which cover a part of the surface on a side opposite to the one face side of the resin portion are formed, and a second substrate on which a plurality of second electrodes corresponding to the plurality of first electrodes are formed on the surface facing the one face, in which the first substrate and the second substrate are joined in a state in which the first electrode and the second electrode corresponding to each other are electrically connected, the method including forming the resin portion on the one face; forming the first electrode in which the first electrode which covers the resin portion is formed; removing a part of the resin portion using wet etching in a state in which the first electrode is formed, and forming an interval between the resin portion and the one face, by leaving a portion which is in contact with the one face in at least a part of the resin portion; and removing a part of the resin portion using dry etching after the wet etching.

According to the method, it is possible to prevent residue from remaining on the first substrate in the dry etching, since the resin portion on the first substrate is removed in advance using the wet etching. In addition, since the resin portion on the first substrate is removed before the dry etching, it is possible to prevent a deteriorated resin portion from remaining as residue even when the resin portion deteriorates in the dry etching.

According to still another aspect of the invention, there is provided a manufacturing method of a joint structure which includes a first substrate on which a resin portion which protrudes from one face, and is formed of a resin, and a plurality of first electrodes which cover a part of the surface on a side opposite to the one face side of the resin portion are formed, and a second substrate on which a plurality of second electrodes corresponding to the plurality of first electrodes are formed on the surface facing the one face side, in which the first substrate and the second substrate are joined in a state in which the first electrode and the second electrode corresponding to each other are electrically connected, the method including forming the resin portion on the one face; forming the first electrode which covers the resin portion; removing a part of the resin portion using dry etching in a state in which the first electrode is formed; and removing a part of the resin portion using wet etching after the dry etching, and forming an interval between the resin portion and the one face, by leaving a portion which is in contact with the one face in at least a part of the resin portion.

According to the method, even when residue remains after the dry etching, it is possible to remove the residue using the wet etching thereafter. In this manner, it is possible to further reliably prevent the residue from remaining.

According to still another aspect, there is provided a manufacturing method of a joint structure which includes a first substrate on which a resin portion which protrudes from one face, and is formed of a resin, and a plurality of first electrodes which cover a part of the surface on a side opposite to the one face side of the resin portion are formed, and a second substrate on which a plurality of second electrodes corresponding to the plurality of first electrodes are formed on the surface facing the one face side, in which the first substrate and the second substrate are joined in a state in which the first electrode and the second electrode corresponding to each other are electrically connected, the method including forming the resin portion on the one face; removing a part of the resin portion using wet etching, and forming an interval between the resin portion and the one face, by leaving a portion which is in contact with the one face in at least a part of the resin portion; forming the first electrode which covers the resin portion, after the wet etching; and removing a part of the resin portion using dry etching, in a state in which the first electrode is formed.

According to the method, sine the resin portion on the first substrate is removed in advance in the wet etching, it is possible to prevent residue from remaining on the first substrate in the dry etching. In addition, since the resin portion on the first substrate is removed by using the forming of the first electrode and the dry etching, even when the resin portion deteriorates in the forming of the first electrode and the dry etching, it is possible to prevent the deteriorated resin portion from remaining as residue.

BRIEF DESCRIPTION OF THE DRAWINGS

The invention will be described with reference to the accompanying drawings, wherein like numbers reference like elements.

FIG. 18 is a plan view in which main portions of a sealing plate according to a second embodiment is enlarged.

FIG. 19 is a sectional view which is cut along line XIX-XIX in FIG. 18.

FIG. 20 is a state transition diagram of a section in an extending direction of a resin portion which describes a forming method of a bump electrode according to the second embodiment.

FIG. 21 is a state transition diagram of a section in a direction orthogonal to the extending direction of the resin portion which describes a forming method of the bump electrode according to the second embodiment.

DESCRIPTION OF EXEMPLARY EMBODIMENTS

Figure 1:
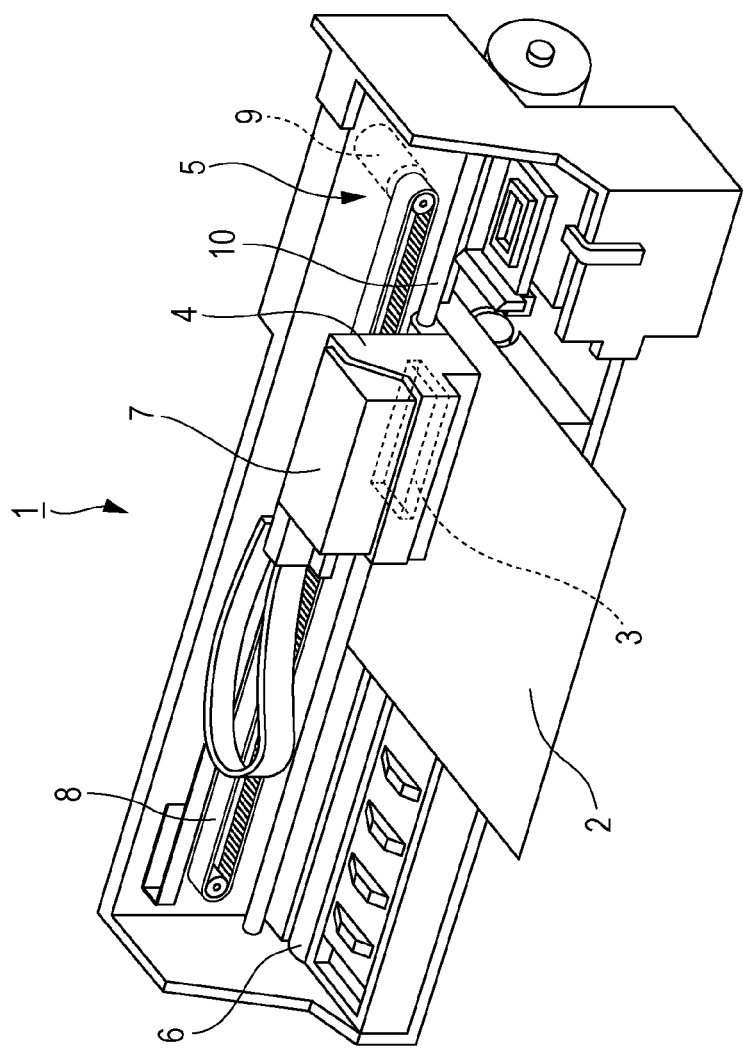
FIG. 1 is a perspective view which describes a configuration of a printer.

Hereinafter, embodiments for executing the invention will be described with reference to accompanying drawings. Various limitations are performed as a preferable specific example of the invention in embodiments which will be described below; however, the scope of the invention is not limited to these forms, as long as there is no description which limits the invention, particularly. In addition, in the following, a joint structure incorporated in an ink jet recording head (hereinafter, referred to as recording head) 3 as a type of a liquid ejecting head will be described as an example of the joint structure of the invention. FIG. 1 is a perspective view of an ink jet printer (hereinafter, referred to as printer) 1 as a type of a liquid ejecting apparatus on which the recording head 3 is mounted.

The printer 1 is an apparatus for performing recording of an image, or the like, by ejecting ink (a type of liquid) on the surface of a recording medium 2 (a type of landing target) such as a recording sheet. The printer 1 is provided with the recording head 3, a carriage 4 attached to the recording head 3, a carriage moving mechanism 5 which causes the carriage 4 to move in the main scanning direction, a transport mechanism 6 which moves the recording medium 2 in the sub-scanning direction, and the like. Here, the ink is stored in an ink cartridge 7 as a liquid supply source. The ink cartridge 7 is detachably mounted on the recording head 3. In addition, it is also possible to adopt a configuration in which the ink cartridge is disposed on a main body side of the printer, and ink is supplied to the recording head through an ink supply tube from the ink cartridge.

The carriage moving mechanism 5 is provided with a timing belt 8. In addition, the timing belt 8 is driven by a pulse motor 9 such as a DC motor. Accordingly, when the pulse motor 9 is driven, the carriage 4 is guided to a guide rod 10 stretched over the printer 1, and reciprocates in the main scanning direction (width direction of recording medium 2). A position of the carriage 4 in the main scanning direction is detected by a linear encoder (not illustrated) as a type of a position information detecting unit. The linear encoder transmits a detection signal thereof, that is, an encoder pulse (a type of position information) to a control unit of the printer 1.

Figure 2:
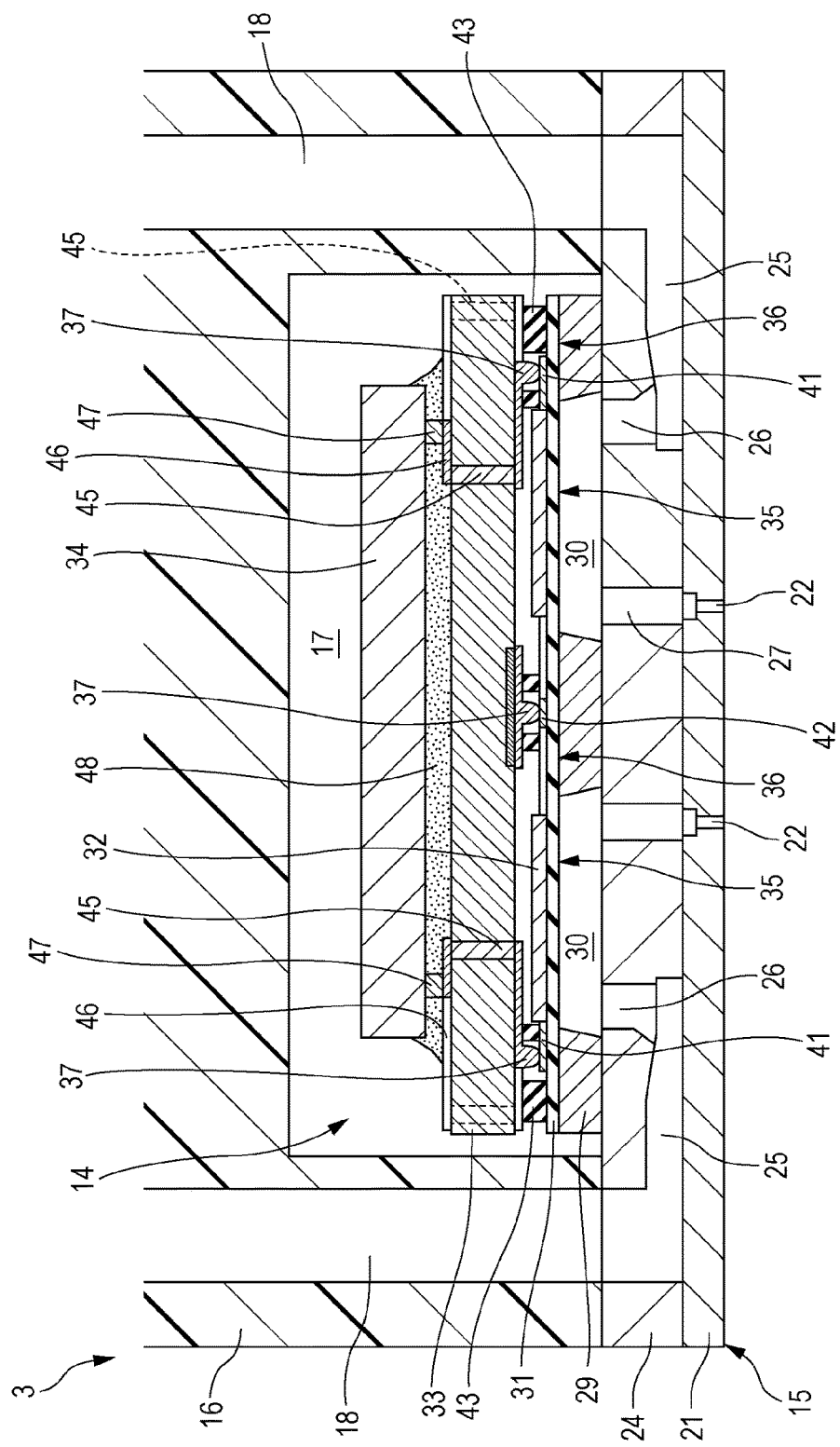
FIG. 2 is a sectional view which describes a configuration of a recording head.

Subsequently, the recording head 3 will be described. FIG. 2 is a sectional view which describes a configuration of the recording head 3. In the following descriptions, a stacking direction of each member will be described as a vertical direction, appropriately. As illustrated in FIG. 2, the recording head 3 in the embodiment is attached to the head case 16 in a state in which an actuator unit 14 (a type of piezoelectric device in invention) and a flow path unit 15 are stacked.

A head case 16 is a box-shaped member of a synthetic resin, and a liquid introducing path 18 through which ink is supplied to each pressure chamber 30 is formed in the head case. The liquid introducing path 18 is a space for storing ink which is common in a plurality of the pressure chambers 30, along with a common liquid chamber 25 which will be described later. According to the embodiment, two liquid introducing paths 18 are formed corresponding to columns of the pressure chamber 30 which are aligned in two columns. In addition, an accommodating space 17 which is recessed in a parallelepiped shape from a lower face (face on nozzle plate 21 side) of the head case 16 to a halfway of the head case 16 in a height direction is formed at a portion on the lower side (nozzle plate 21 side) of the head case 16. When a flow path unit 15 which will be described later is joined to the lower face of the head case 16 in a positioned state, the actuator unit 14 (pressure chamber forming substrate 29, sealing plate 33, driving IC 34, and the like) which is stacked on a communicating substrate 24 is accommodated in the accommodating space 17.

The flow path unit 15 in the embodiment includes the communicating substrate 24 and the nozzle plate 21. The nozzle plate 21 is a silicon substrate which is joined to the lower face (face on side opposite to pressure chamber forming substrate 29) of the communicating substrate 24. According to the embodiment, an opening on the lower face side of a space which becomes a common liquid chamber 25 which will be described later is sealed, using the nozzle plate 21. In addition, a plurality of nozzles 22 are linearly (in column shape) open to the nozzle plate 21. Two columns of the nozzles 22 (that is, nozzle column) formed of the plurality of nozzles 22 are formed in the nozzle plate 21. The nozzles 22 which configure each nozzle column are provided at equal intervals along the sub-scanning direction, for example, at a pitch corresponding to a dot forming density from a nozzle 22 on one end side to a nozzle 22 on the other end side. It is also possible to join the nozzle plate to a region on the communicating substrate which is separated from the common liquid chamber toward the inside, and seal the opening of the space on the lower face side which becomes the common liquid chamber using a member such as a compliance sheet with flexibility, for example. In this manner, it is possible to make the nozzle plate small as much as possible.

The communicating substrate 24 is a silicon substrate which configures a higher part (portion on head case 16 side) of the flow path unit 15. As illustrated in FIG. 2, a common liquid chamber 25 which communicates with the liquid introducing path 18, and in which ink common to each pressure chamber 30 is stored, an individual communicating path 26 which individually supplies ink from the liquid introducing path 18 to each of the pressure chambers 30 through the common liquid chamber 25, and a nozzle communicating path 27 through which the pressure chamber 30 and the nozzle 22 communicate are formed on the communicating substrate 24 using etching, or the like. A plurality of the individual communicating paths 26 and the nozzle communicating paths 27 are formed along the nozzle column direction. In addition, the common liquid chamber 25 is a long hollow portion which is formed along the nozzle column direction, and as illustrated in FIG. 2, two columns of the common liquid chamber are formed corresponding to columns of the pressure chamber 30 which are aligned in two columns.

The actuator unit 14 in the embodiment is joined to a top face of the communicating substrate 24. As illustrated in FIG. 2, the actuator unit 14 is set to a unit by stacking the pressure chamber forming substrate 29, a vibrating plate 31, a piezoelectric element 32 as a type of an actuator, a sealing plate 33, and the driving IC 34. The actuator unit 14 is formed to be smaller than the accommodating space 17 so as to be accommodated in the accommodating space 17.

The pressure chamber forming substrate 29 is a silicon substrate which configures a lower part (portion on flow path unit 15 side) of the actuator unit 14. A plurality of spaces which can be the pressure chamber 30 are aligned along the nozzle column direction on the pressure chamber forming substrate 29, in a state in which a part thereof is removed in the plate thickness direction using etching, or the like. The lower part of the space is partitioned by the communicating substrate 24, the higher part is partitioned by the vibrating plate 31, and the space configures the pressure chamber 30. In addition, the space, that is, the pressure chamber 30 is formed in two columns, corresponding to the nozzle column of two columns. Each pressure chamber 30 is a hollow portion which is long in a direction orthogonal to the nozzle column direction, the individual communicating path 26 communicates with one end portion in a longitudinal direction, and the nozzle communicating path 27 communicates with the other end portion.

The vibrating plate 31 is a thin film-shaped member with elasticity, and is stacked on a top face (face on side opposite to flow path unit 15 side) of the pressure chamber forming substrate 29. A higher opening of the space which can be the pressure chamber 30 is sealed with the vibrating plate 31. In other words, the pressure chamber 30 is partitioned by the vibrating plate 31. A portion of the pressure chamber 30 in the vibrating plate 31 (specifically, higher opening of pressure chamber 30) functions as a displacement portion which is displaced in a direction far from the nozzle 22 or a direction close to the nozzle along with flexural deformation of the piezoelectric element 32. That is, a region in the vibrating plate 31 corresponding to the higher opening of the pressure chamber 30 becomes a driving region 35 in which flexural deformation is allowed. Meanwhile, a region in the vibrating plate 31 separated from the higher opening of the pressure chamber 30 becomes a non-driving region 36 in which flexural deformation is prevented. In addition, the pressure chamber forming substrate 29 on which the vibrating plate 31 is stacked, that is, the vibrating plate 31 and the pressure chamber forming substrate 29 correspond to a second substrate in the invention.

The vibrating plate 31 is formed of an elastic film formed of silicon dioxide ($SiO_2$) which is formed on a top face of the pressure chamber forming substrate 29, and an insulating film formed of zirconium oxide ($ZrO_2$) which is formed on the elastic film. The piezoelectric elements 32 are respectively stacked in a region on the insulating film (face on side opposite to pressure chamber forming substrate 29 side of vibrating plate 31) corresponding to each pressure chamber 30, that is, in the driving region 35. The piezoelectric elements 32 according to the embodiment are piezoelectric elements of a so-called flexure mode. The piezoelectric elements 32 are formed by sequentially stacking a lower electrode layer, a piezoelectric layer, and a higher electrode layer on the vibrating plate 31. Any one of the higher electrode layer and the lower electrode layer becomes a common electrode which is commonly formed in each of the piezoelectric elements 32, and the other thereof becomes an individual electrode which is individually formed in each of the piezoelectric elements 32. When an electric field corresponding to a difference in potential of both of the electrodes is applied to a portion between the lower electrode layer and the higher electrode layer, the piezoelectric element 32 is deformed in a bending manner in a direction far from the nozzle 22 or a direction close thereto. In addition, piezoelectric elements 32 in the embodiment are formed in two columns along the nozzle column direction, corresponding to the pressure chambers 30 which are aligned in two columns along the nozzle column direction.

An individual terminal 41 and a common terminal 42 as a type of a second electrode in the invention are stacked in the non-driving region 36 of the vibrating plate 31 in the embodiment. That is, the individual terminal 41 and the common terminal 42 are formed on a top face of the vibrating plate 31 (face which faces sealing plate 33). Specifically, the individual terminal 41 is formed on the outer side of the column of the piezoelectric element 32 on one side, and the outer side of the column of the piezoelectric element 32 on the other side, in a direction orthogonal to the nozzle column direction, and the common terminal 42 is formed between columns of both of the piezoelectric elements 32. The individual terminal 41 is a terminal portion of wiring extended from the individual electrode of the piezoelectric element 32, and is electrically connected to the individual electrode. The individual terminal 41 is formed in each of the piezoelectric elements 32. Meanwhile, the common terminal 42 is a terminal portion of wiring extended from the common electrode of the piezoelectric element 32, and is electrically connected to the common electrode. The common terminal 42 in the embodiment is connected to both of the common electrode of the column of the piezoelectric element 32 on one side and the common electrode of the column of the piezoelectric element 32 on the other side. In addition, conductive layers 39 of the bump electrode 37 (to be described later) which correspond to the individual terminal 41 and the common terminal 42, respectively, are in contact with the individual terminal 41 and the common terminal 42.

As illustrated in FIG. 2, the sealing plate 33 (corresponding to first substrate in invention) is a silicon substrate which is disposed with an interval with respect to the piezoelectric element 32, in a state in which a photosensitive adhesive 43 with an insulating property is interposed between the sealing plate and the vibrating plate 31. A plurality of the bump electrodes 37 which output a driving signal from the driving IC 34 to the piezoelectric element 32 side are formed on the lower face (face on pressure chamber forming substrate 29 side) of the sealing plate 33 in the embodiment. As illustrated in FIG. 2, the bump electrode 37 is formed at a position corresponding to one individual terminal 41 which is formed on the outer side of the piezoelectric element 32 on one side, a position corresponding to the other individual terminal 41 which is formed on the outer side of the piezoelectric element 32 on the other side, a position corresponding to the common terminal 42 which is formed between columns of both of the piezoelectric elements 32, and the like. In addition, each of the bump electrodes 37 is connected to a corresponding individual terminal 41 or a corresponding common terminal 42, respectively.

Here, the sealing plate 33 and the pressure chamber forming substrate 29 are joined in a state of being pressurized in a direction in which both of the sealing plate and the pressure chamber forming substrate get closer so that each of the bump electrodes 37, and the individual terminal 41 and the common terminal 42 corresponding thereto are electrically connected, reliably. In addition, a photosensitive adhesive 43 formed on the outer side of the pressure chamber forming substrate 29 among the photosensitive adhesives 43 which bond the sealing plate 33 and the pressure chamber forming substrate 29 is formed so as to surround the two columns of the piezoelectric element 32. That is, each of the piezoelectric elements 32 is sealed in a space surrounded with the pressure chamber forming substrate 29, the sealing plate 33, and the photosensitive adhesive 43. The sealing plate 33 and the vibrating plate 31 joined by the photosensitive adhesive 43, and the pressure chamber forming substrate 29 on which the vibrating plate 31 and the piezoelectric element 32 are stacked correspond to the joint structure in the invention.

Figure 3:
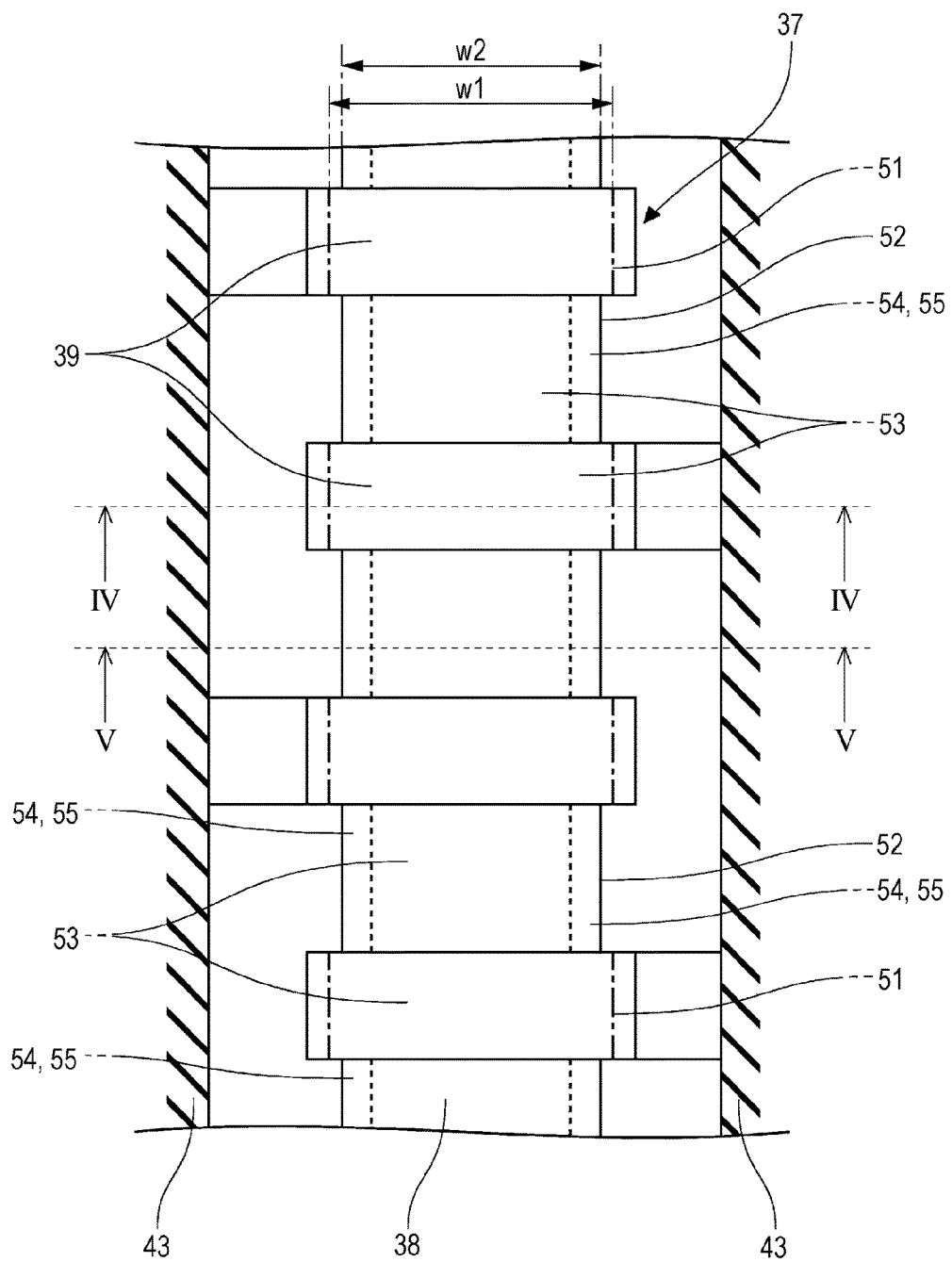
FIG. 3 is a plan view in which main portions of a sealing plate are enlarged.
Figure 4:
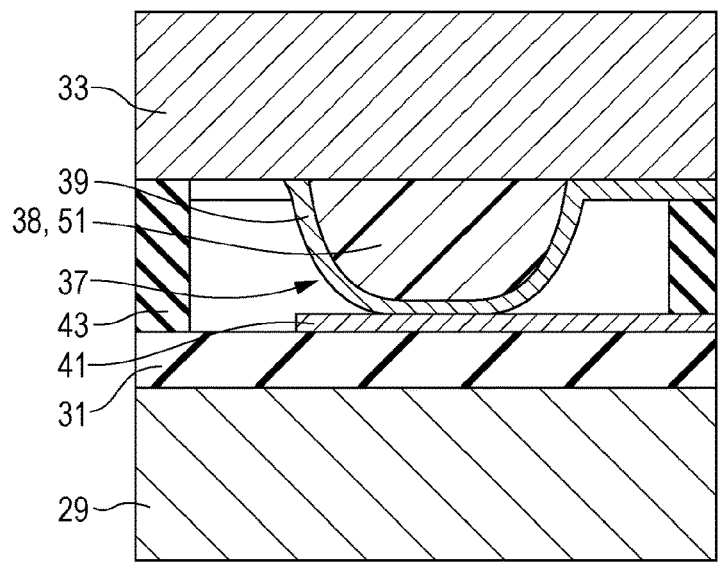
FIG. 4 is a sectional view which is cut along line IV-IV in FIG. 3.

As illustrated in FIG. 4, and the like, the bump electrode 37 in the embodiment is a so-called resin core bump which is formed of a resin portion 38 formed of a resin which protrudes from the lower face (corresponding to one face in invention) of the sealing plate 33, and the conductive layer 39 (a type of first electrode in invention) which covers a part of the surface of the resin portion 38 (specifically, surface on side opposite to lower face of sealing plate 33). The plurality of conductive layers 39 of the bump electrode 37, which are electrically connected to the individual terminal 41 are formed along the nozzle column direction, corresponding to the piezoelectric elements 32 which are aligned along the nozzle column direction, as illustrated in FIG. 3. In addition, at least one or more conductive layers 39 which are electrically connected to the common terminal 42 are formed, corresponding to the common terminal 42. In addition, as illustrated in FIG. 2, the conductive layer 39 of the bump electrode 37 is extended to a position separated from the resin portion 38, and is connected to wiring on the top face side 46 which is stacked on a top face (face on side opposite to pressure chamber forming substrate 29) of the sealing plate 33 through penetrating wiring 45 which penetrates the sealing plate 33 in a plate thickness direction. In addition, a configuration of the bump electrode 37 will be described later in detail.

The driving IC 34 is an IC chip for driving the piezoelectric element 32, and is stacked on the top face of the sealing plate 33 through an adhesive 48 such as an anisotropic conductive film (ACF). As illustrated in FIG. 2, a plurality of the IC terminals 47 connected to a terminal portion of the wiring on the top face side 46 are formed on the lower face (face on sealing plate 33 side) of the driving IC 34. A plurality of IC terminals 47 among the IC terminals 47 which correspond to the individual terminal 41 are aligned along the nozzle column direction. According to the embodiment, two columns of the IC terminal 47 are formed corresponding to the column of the piezoelectric element 32 which are aligned in two columns.

In addition, the recording head 3 with the above described configuration introduces ink from the ink cartridges 7 to the pressure chamber 30 through the liquid introducing path 18, the common liquid chamber 25, the individual communicating path 26, and the like. When a driving signal from the driving IC 34 is supplied to the piezoelectric element 32 through the bump electrode 37, or the like, in this state, the piezoelectric element 32 is driven, and a pressure change occurs in ink in the pressure chamber 30. The recording head 3 ejects ink droplets from the nozzle 22, using the pressure change.

Subsequently, a configuration of the bump electrode 37 will be described in detail. FIG. 3 is a plan view in which a part of a region in which the bump electrode 37 connected to the individual terminal 41 on one side is formed is viewed from the lower face side (pressure chamber forming substrate 29 side) of the sealing plate 33. In addition, FIG. 4 is a sectional view cut along line IV-IV in FIG. 3, and FIG. 5 is a sectional view cut along line V-V in FIG. 3.

As illustrated in FIG. 3, and the like, the resin portion 38 of the bump electrode 37 which is connected to the individual terminal 41 is formed along the nozzle column in a protruding manner on the surface of the sealing plate 33. The resin portion 38 according to the embodiment is disposed between the photosensitive adhesives 43 which are formed in two columns on the outer side of the column of the piezoelectric element 32. In addition, as illustrated in FIGS. 4 and 5, the surface of the resin portion 38 is formed in an arc shape in a section thereof. In addition, as illustrated in FIGS. 3 and 4, the conductive layer 39 is stacked on the surface of a portion in the resin portion 38 corresponding to the individual terminal 41. A plurality of the conductive layer 39 are formed with intervals in the nozzle column direction, corresponding to the individual terminal 41. For this reason, a covered portion 51 (corresponding to first portion in invention) covered with the conductive layer 39, and an exposed portion 52 (corresponding to second portion in invention) which is exposed from the conductive layer 39 without being covered, by being separated from the conductive layer 39 are alternately formed in the resin portion 38 along the nozzle column direction. Each of the conductive layers 39 is drawn around from a region overlapped with the resin portion 38 to a region corresponding to the penetrating wiring 45 on the outer side thereof. According to the embodiment, the conductive layers 39 of the bump electrodes 37 which are adjacent to each other are drawn out in a different direction. That is, a conductive layer 39 drawn out to one side from the region overlapped with the resin portion 38, and a conductive layer 39 drawn out to the other side from the region overlapped with the resin portion 38 are alternately formed along the nozzle column direction. In addition, each of the conductive layers 39 is not limited to the above described configuration, and it is also possible to adopt a configuration of being drawn out to the same side, respectively. As the resin portion 38, for example, a resin with elasticity formed of a polyimide resin, a phenol resin, an epoxy resin, or the like, is used. In addition, as the conductive layer 39, for example, gold (Au), titanium (Ti), aluminum (Al), chrome (Cr), nickel (Ni), copper (Cu), or metal formed of an alloy of these, or the like, is used.

Figure 5:
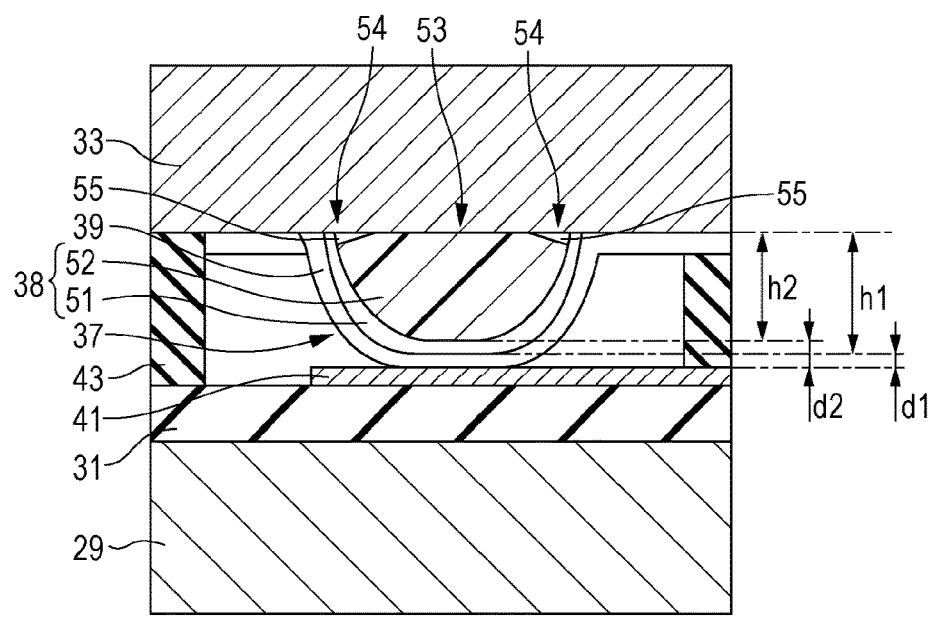
FIG. 5 is a sectional view which is cut along line V-V in FIG. 3.

Here, as illustrated in FIGS. 3 and 5, the exposed portion 52 in the resin portion 38 which is not covered with the conductive layer 39 is formed to be smaller than the covered portion 51 which is covered with the conductive layer 39 using dry etching. That is, a width w2 of the exposed portion 52 (dimension in direction orthogonal to extending direction (longitudinal direction) of resin portion 38) is formed to be smaller than a width w1 of the covered portion 51. In other words, the width w1 of the covered portion 51 is formed to be larger than the width w2 of the exposed portion 52. A height of the exposed portion 52 (dimension from surface to apex portion of sealing plate 33) h2 is formed to be lower than a height h1 of the covered portion 51. In other words, the height h1 of the covered portion 51 is formed to be higher than the height h2 of the exposed portion 52. For this reason, in a direction intersecting the surface of the sealing plate 33 (height direction), the distance d1 between the covered portion 51 and the individual terminal 41 becomes shorter than the distance d2 between the exposed portion 52 and the individual terminal 41. In addition, in the covered portion 51, since the conductive layer 39 and the individual terminal 41 are connected to each other, the distance d1 between the covered portion 51 and the individual terminal 41 becomes the same as the thickness of the conductive layer 39 at a portion which is in contact with the individual terminal 41.

In addition, as illustrated in FIG. 5, an interval 55 is formed between portions on both ends of the exposed portion 52 in the width direction and the sealing plate 33. That is, a first region 53 in which the resin portion 38 is in contact with the sealing plate 33, and a second region 54 in which the resin portion 38 is separated from the sealing plate 33, and the interval 55 is provided between the resin portion 38 and the sealing plate 33 are formed, in a region in which the resin portion 38 of the sealing plate 33 is formed (arranged). As illustrated in FIG. 3, the second region 54 (that is, interval 55) in the embodiment is formed all over the length direction (extending direction of resin portion 38) of the exposed portion 52, in both end portions of the exposed portion 52 in the width direction. In addition, the first region 53 in which the resin portion 38 and the sealing plate 33 are in contact is formed in a region interposed between the second region 54 on both sides in the width direction. In other words, the second region 54 is formed on the outer side of the first region 53 in a plane on the pressure chamber forming substrate 29 side of the sealing plate 33. In addition, the interval 55 in the embodiment is not formed in a region in which the covered portion 51 is formed. For this reason, the entire region in which the covered portion 51 is formed becomes the first region 53. In short, the second region 54 in the embodiment is formed in a region corresponding to a portion between the covered portion 51 and the covered portion 51, in other word, the second region is formed in a region corresponding to a portion between the conductive layers 39. In addition, a forming method of the bump electrode 37 including such a resin portion 38 will be described in detail later.

In this manner, since a portion on the outer side of the exposed portion 52 in the width direction is separated from the sealing plate 33, it is possible to suppress residue from remaining on the sealing plate 33, even if the exposed portion 52 is set to be small using etching. That is, it is possible to prevent residue from remaining at a portion in which a resin is removed from a position on the sealing plate 33 using etching. In this manner, it is possible to suppress migration between the conductive layers 39 due to residue. As a result, it is possible to suppress a decrease in insulation reliability in between the conductive layers 39, and suppress a decrease in reliability of the actuator unit 14. It is possible to suppress a decrease in reliability of the recording head 3, and suppress a decrease in reliability of the printer 1. In addition, a path between the conductive layer 39 which passed through the surface of the resin portion 38 and a conductive layers 39 adjacent thereto becomes long, and it is possible to suppress migration through the surface of the resin portion 38, on the sealing plate 33.

Since the height h1 of the covered portion 51 is formed to be higher than the height h2 of the exposed portion 52, in other words, since the distance d1 between the covered portion 51 and the individual terminal 41 is formed to be shorter than the distance d2 between the exposed portion 52 and the individual terminal 41, a path between the conductive layer 39 which goes through the surface of the resin portion 38 and the conductive layer 39 adjacent thereto becomes long, and it is possible to suppress migration through the surface of the resin portion 38. In addition, it is possible to reduce pressure applied to a portion between the sealing plate 33 and the pressure chamber forming substrate 29 when joining the conductive layer 39 and the individual terminal 41 corresponding thereto. It is possible to make an elastic restoring force of the resin portion 38 small, in a state in which the conductive layer 39 and the individual terminal 41 are joined. As a result, it is possible to suppress damage, or the like, of the sealing plate 33 or the pressure chamber forming substrate 29. In addition, it is possible to prevent a portion other than the conductive layer 39 (that is, exposed portion 52) from being in contact with the second electrode. In this manner, it is possible to further reliably connect the conductive layer 39 and the individual terminal 41. According to the embodiment, since the second region 54 is formed in a region corresponding to a portion between two conductive layers 39, it is possible to reliably suppress migration at the portion between the conductive layers 39.

Subsequently, a manufacturing method of the recording head, in particular, a forming method of the bump electrode 37 will be described in detail. FIGS. 6, 8, 10 and 12 are state transition diagrams of a section of a substrate which becomes the sealing plate 33 (hereinafter, simply referred to as sealing plate 33) in a direction orthogonal to the extending direction of the resin portion 38 which describe the forming method of the bump electrode 37. FIGS. 7, 9, 11 and 13 are state transition diagrams of a section of the sealing plate 33 in an extending direction of the resin portion 38 which describe the forming method of the bump electrode 37. In addition, in FIGS. 6 to 13, a face on the side which faces the pressure chamber forming substrate 29 of the sealing plate 33 (lower face in FIGS. 2 and 4) is denoted as a top face. The same is applied to FIGS. 14, 15, 20 to 27 which illustrate other embodiments which will be described later.

Figure 6:
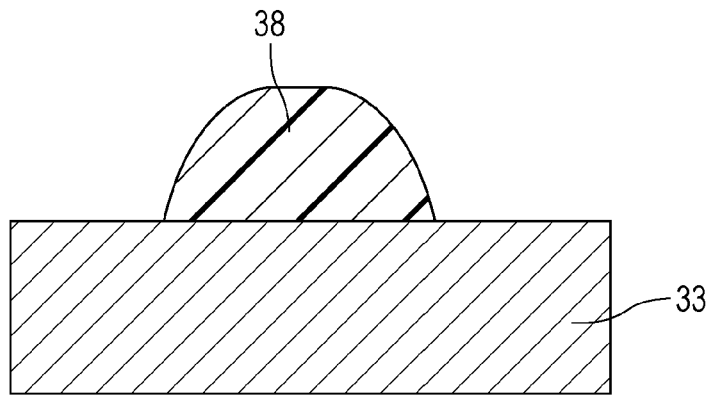
FIG. 6 is a state transition diagram of a section in a direction orthogonal to an extending direction of the resin portion which describes a forming method of a bump electrode.
Figure 7:
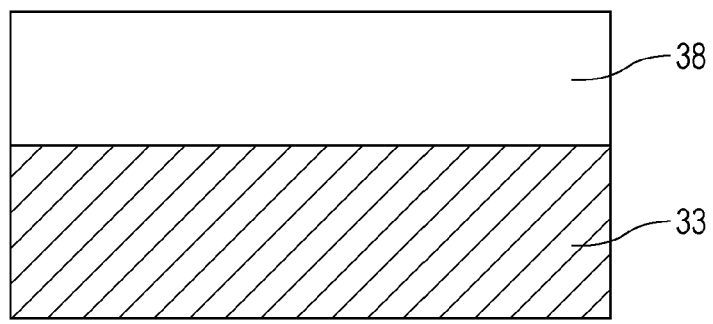
FIG. 7 is a state transition diagram of a section in the extending direction of the resin portion which describes a forming method of the bump electrode.

First, as illustrated in FIGS. 6 and 7, the resin portion 38 is formed on the surface of the sealing plate 33 on which the penetrating wiring 45, and the like, is formed in a forming process of the resin portion. Specifically, for example, a resin layer is formed on the surface of the sealing plate 33, and the resin layer is formed at a predetermined position through a photolithography process, or the like. That is, the resin layer of which a section is in a rectangular shape, and which extends along the nozzle column direction is formed. When such a resin layer is formed, the sealing plate 33 is heated. Viscosity of the resin layer becomes low due to the heat, and a corner there of becomes dull. Thereafter, the resin layer is solidified when cooling the sealing plate 33. As a result, as illustrated in FIG. 6, the resin portion 38 of which the surface becomes an arc shape is formed.

Figure 8:
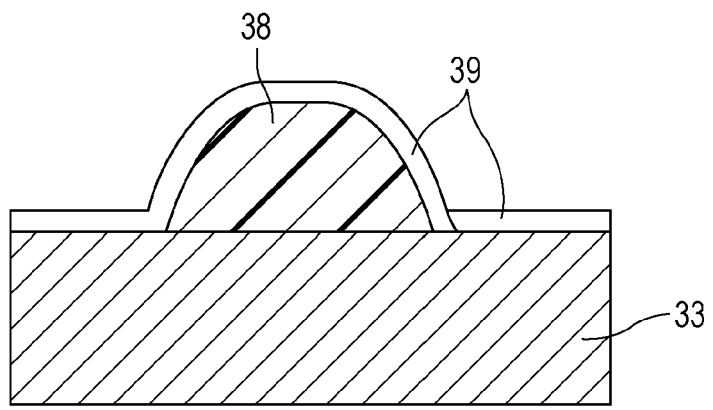
FIG. 8 is a state transition diagram of a section in a direction orthogonal to the extending direction of the resin portion which describes a forming method of the bump electrode.
Figure 9:
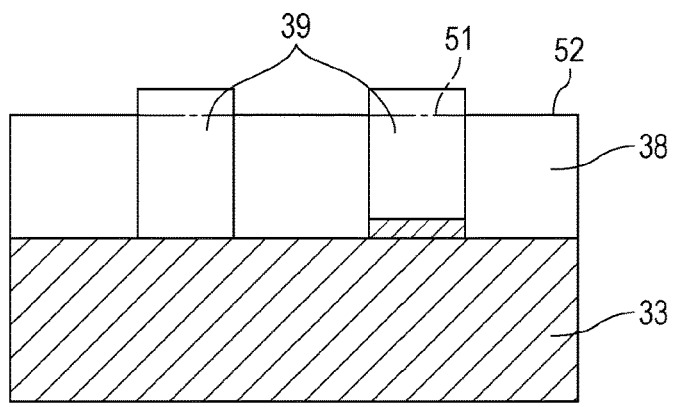
FIG. 9 is a state transition diagram of a section in the extending direction of the resin portion which describes a forming method of the bump electrode.

Subsequently, the conductive layer 39 is formed on the resin portion 38 in a conductive layer forming process (corresponding to first electrode forming process in invention). Specifically, first, a metal layer is formed on the entire surface of a surface on a side on which the resin portion 38 of the sealing plate 33 is formed. At this time, the surface of the resin portion 38 is also covered with the metal layer. Thereafter, a resist layer is formed on the metal layer, and the conductive layer 39 is formed at a predetermined position through a photolithography process, an etching process, and the like. That is, as illustrated in FIGS. 8 and 9, the conductive layer 39 is formed on the surface of the sealing plate 33 and the surface of the resin portion 38. In this manner, the covered portion 51 covered with the conductive layer 39 and the exposed portion 52 which is not covered with the conductive layer 39 are formed in the resin portion 38.

Figure 10:
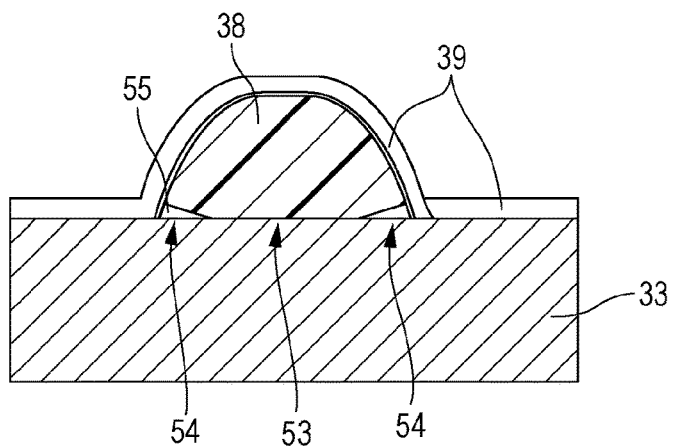
FIG. 10 is a state transition diagram of a section in the direction orthogonal to the extending direction of the resin portion which describes a forming method of the bump electrode.
Figure 11:
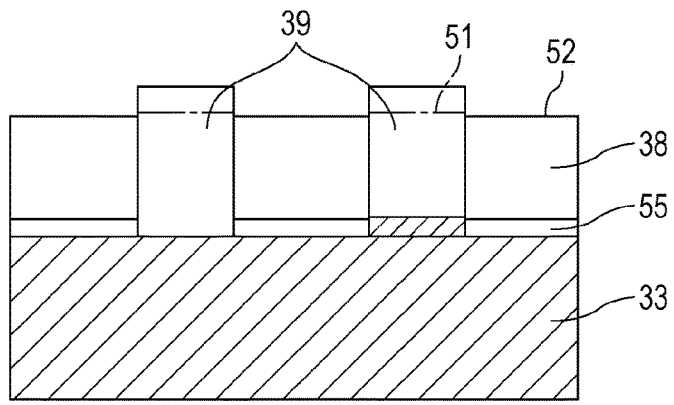
FIG. 11 is a state transition diagram of a section in the extending direction of the resin portion which describes a forming method of the bump electrode.
Figure 12:
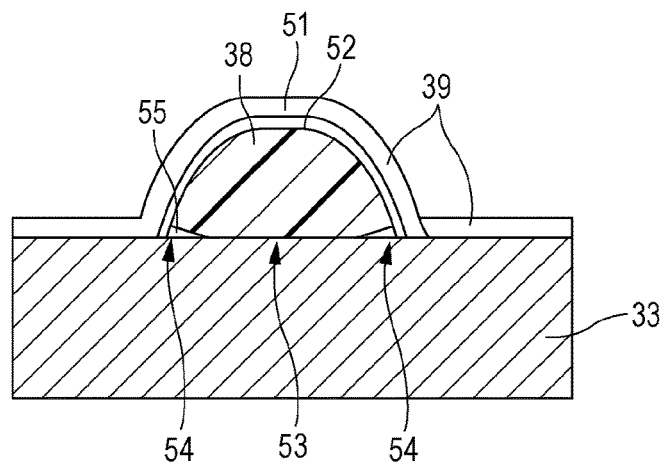
FIG. 12 is a state transition diagram of a section in the direction orthogonal to the extending direction of the resin portion which describes a forming method of the bump electrode.
Figure 13:
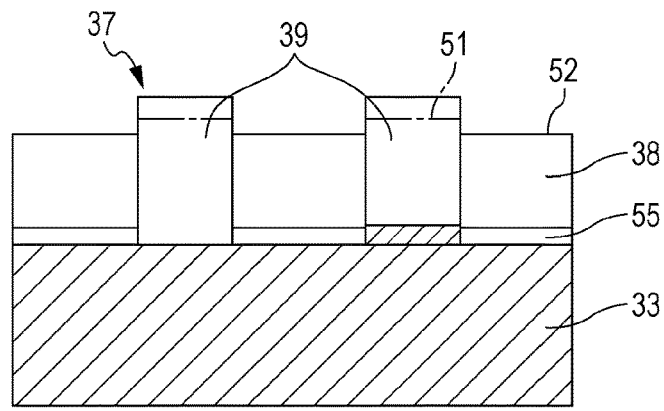
FIG. 13 is a state transition diagram of a section in the extending direction of the resin portion which describes a forming method of the bump electrode.

When forming the conductive layer 39 on the resin portion 38, the process proceeds to a wet etching process in which a part of the resin portion 38 is removed, using wet etching. Specifically, the entire surface of the sealing plate 33 is bleached in an etching solution which can remove the resin portion 38, in the wet etching process. At this time, the conductive layer 39 functions as a mask with respect to the etching solution. For this reason, in the resin portion 38, the covered portion 51 is rarely etched, and the exposed portion 52 is mainly etched. That is, as illustrated in FIGS. 10 and 11, the surface portion (arc portion) of the exposed portion 52 is etched, and an external form of the exposed portion 52 becomes slightly smaller than that of the covered portion 51. In addition, the etching solution proceeds toward the inside from the outside on an interface with the sealing plate 33 in the exposed portion 52. In this manner, a part of a portion of the exposed portion 52 located on the interface with the sealing plate 33 is etched, and the interval 55 is formed in the portion. In addition, an etching time (time for bleaching sealing plate 33 in etching solution) is adjusted so that the interface between the exposed portion 52 and the sealing plate 33 is not completely separated. In this manner, it is possible to form the interval 55 at both end portions of the exposed portion 52 in the width direction, while remaining a portion which is in contact with the sealing plate 33 at a center portion of the resin portion 38 in the width direction. That is, the first region 53 in which the resin portion 38 is in contact with the sealing plate 33, and a second region 54 in which the resin portion 38 is separated from the sealing plate 33 are formed in the region in which resin portion 38 of the sealing plate 33 is formed.

After the wet etching process, the process proceeds to a dry etching process in which a part of the resin portion 38 is removed, using dry etching. In this manner, a part of the exposed portion 52 is etched, and the above described bump electrode 37 is formed on the sealing plate 33. Specifically, a part of the surface of the exposed portion 52 is removed by performing dry etching, using the conductive layer 39 as a mask. In this manner, the surface portion of the exposed portion 52 is further etched, and an external form of the exposed portion 52 becomes one size smaller than that of the covered portion 51. That is, a height of the exposed portion 52 from the surface of the sealing plate 33 becomes lower than that of the covered portion 51 from the surface of the sealing plate 33, and a width of the exposed portion 52 becomes smaller than that of the covered portion 51. Since the resin portion 38 in the second region 54 of the sealing plate 33 is removed in advance in the wet etching process, even when the exposed portion 52 is etched so as to be small in the width direction in this manner, it is possible to prevent residue from remaining on the sealing plate 33. In addition, since the resin portion 38 in the second region 54 of the sealing plate 33 is removed before the dry etching process, it is possible to suppress a situation in which a deteriorated resin portion 38 remains as residue, even when there is a concern that the resin portion 38 may deteriorate due to dry etching. As a result, it is possible to suppress migration between conductive layers 39 due to residue. In addition, in the embodiment, a region of the resin portion 38 in the width direction which is removed by dry etching is set to be smaller than the second region 54 before the dry etching process (state in which dry etching is not performed). For this reason, the second region 54 (that is, interval 55 between sealing plate 33 and exposed portion 52) enters a state of remaining on both end portions of the exposed portion 52 in the width direction, after the dry etching process, as well.

When the bump electrode 37 is formed on the sealing plate 33, as described above, the sealing plate 33 is joined to a substrate as the pressure chamber forming substrate 29 (hereinafter, simply referred to pressure chamber forming substrate 29) on which the vibrating plate 31, the piezoelectric element 32, and the like, are formed. For example, the photosensitive adhesive 43 is formed on any one of the sealing plate 33 and the pressure chamber forming substrate 29. In this state, the photosensitive adhesive 43 is hardened by pressurizing the pressure chamber forming substrate 29 and the sealing plate 33 in a joining direction against an elastic restoring force of the bump electrode 37, and heating the pressure chamber forming substrate and the sealing plate. In this manner, the pressure chamber forming substrate 29 and the sealing plate 33 are joined, and the joint structure formed of both of the substrates is manufactured. Thereafter, the pressure chamber 30 is formed, using etching, after making the pressure chamber forming substrate 29 thin using grinding, using a CMP (chemical mechanical polishing) method, or the like. In addition, the driving IC 34 is joined to the sealing plate 33. In this manner, the actuator unit 14 is manufactured.

When the actuator unit 14 is manufactured, the actuator unit 14 and the flow path unit 15 are joined. In addition, the actuator unit 14 is accommodated in the accommodating space 17 by joining the flow path unit 15 to which the actuator unit 14 is joined to the lower face of the head case 16, and the recording head 3 is manufactured.

Figure 14:
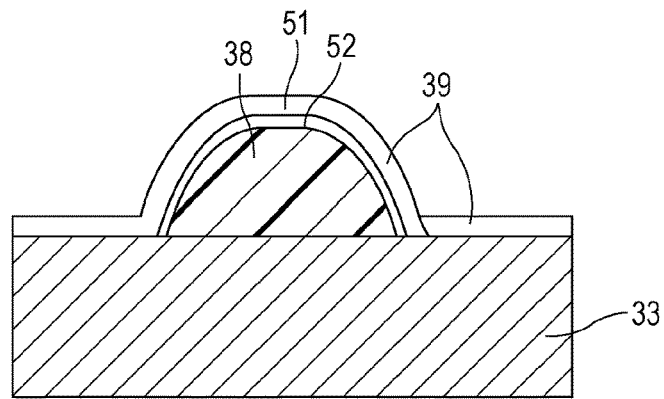
FIG. 14 is a state transition diagram of a section in the direction orthogonal to the extending direction of the resin portion which describes another forming method of the bump electrode.
Figure 15:
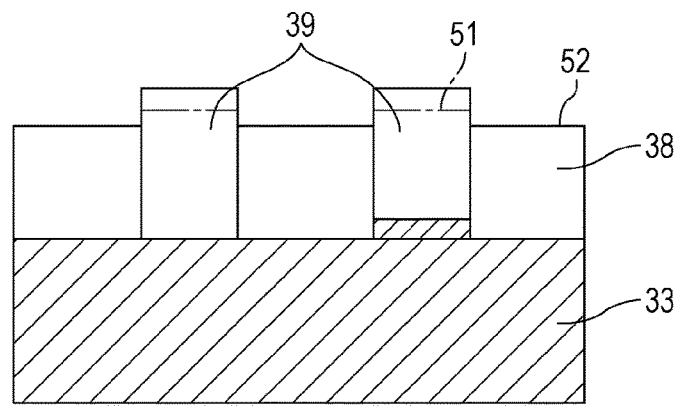
FIG. 15 is a state transition diagram of a section in the extending direction of the resin portion which describes another forming method of the bump electrode.
Figure 16:
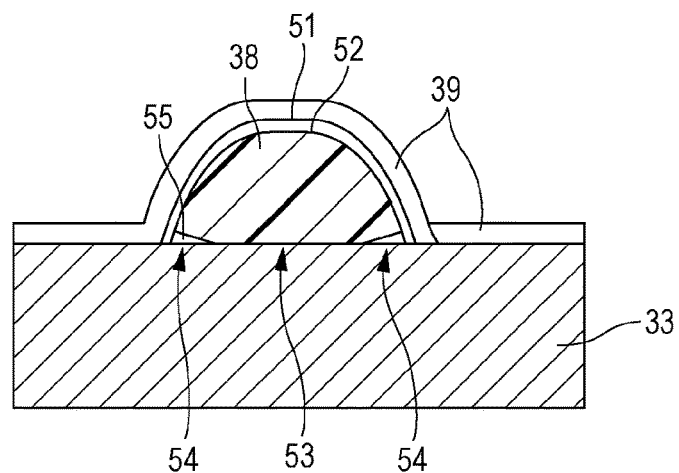
FIG. 16 is a state transition diagram of a section in the direction orthogonal to the extending direction of the resin portion which describes another forming method of the bump electrode.
Figure 17:
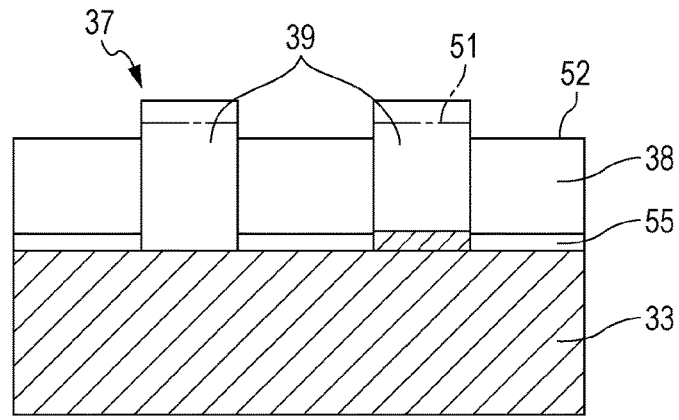
FIG. 17 is a state transition diagram of a section in the extending direction of the resin portion which describes another forming method of the bump electrode.

In a forming method of the above described bump electrode 37, the process proceeds to the dry etching process after the wet etching process; however, it is not limited to this. For example, in another forming method of the bump electrode 37 illustrated in FIGS. 14 to 17, the process proceeds to the wet etching process after the dry etching process. Here, FIGS. 14 and 16 are state transition diagrams of a section of the sealing plate 33 in a direction orthogonal to an extending direction of the resin portion 38 which describe another forming method of the bump electrode 37. In addition, FIGS. 15 and 17 are state transition diagrams of a section of the sealing plate 33 in the extending direction of the resin portion 38 which describe another forming method of the bump electrode 37. Since a forming method of the conductive layer 39 on the resin portion 38 (that is, up to process of forming conductive layer) is the same as the above described forming method of the bump electrode 37 also in the embodiment, descriptions thereof will be omitted.

In the forming method, the process proceeds to the dry etching process in which a part of the resin portion 38 is removed, using dry etching, after the process of forming the conductive layer. That is, dry etching is performed, using the conductive layer 39 as a mask, and a part of the surface of the exposed portion 52 is removed. In this manner, as illustrated in FIGS. 14 and 15, the surface portion of the exposed portion 52 is etched, and the external form of the exposed portion 52 becomes one size smaller than that of the covered portion 51. That is, the height of the exposed portion 52 from the surface of the sealing plate 33 becomes lower than that of the covered portion 51 from the surface of the sealing plate 33, and the width of the exposed portion 52 becomes smaller than that of the covered portion 51.

Subsequently, the process proceeds to the wet etching process. That is, the entire surface of the sealing plate 33 is bleached in an etching solution. Since the conductive layer 39 functions as a mask also in the embodiment, in the resin portion 38, the covered portion 51 is rarely etched, and the exposed portion 52 is mainly etched. In this manner, as illustrated in FIGS. 16 and 17, the surface portion of the exposed portion 52 is further etched, and the external form of the exposed portion 52 becomes smaller than that of the covered portion 51. In addition, the etching solution proceeds toward the inside from the outside on the interface between the exposed portion 52 and the sealing plate 33, and the interval 55 (that is, second region 54) is formed at both end portions of the exposed portion 52 in the width direction, while leaving a portion which is in contact with the sealing plate 33 at a center portion of the resin portion 38 in the width direction (that is, first region 53). In this manner, the bump electrode 37 in the same shape as the above described forming method is manufactured. Since the manufacturing method of the recording head 3 thereafter is the same as the above described method, descriptions thereof will be omitted.

In addition, in the forming method, since wet etching process is performed after dry etching process, it is possible to remove residue in the wet etching process thereafter, even when residue remains at a portion in which the exposed portion 52 is removed on the surface of the sealing plate 33, after the dry etching process. In this manner, it is possible to further reliably prevent residue from remaining. As a result, it is possible to suppress migration between conductive layers 39 due to residue also in the embodiment.

Meanwhile, in the above described first embodiment, the second region 54 is formed only in the region in which the exposed portion 52 of the sealing plate 33 is formed, and is not formed in the region in which the covered portion 51 of the sealing plate 33 is formed; however, it is not limited to this. For example, in a second embodiment illustrated in FIGS. 18 and 19, the second region 54 is formed also in the region in which the covered portion 51 of the sealing plate 33 is formed. FIG. 18 is a plan view in which a sealing plate 33 in the second embodiment is viewed from a lower face side (pressure chamber forming substrate 29 side). In addition, FIG. 19 is a sectional view cut along line XIX-XIX in FIG. 18.

Specifically, as illustrated in FIGS. 18 and 19, the second region 54 in which the resin portion 38 is separated from the sealing plate 33 at both end portions of the covered portion 51 in the width direction, and the interval 55 is provided between the resin portion 38 and the sealing plate 33 is formed in the region in which the covered portion 51 of the sealing plate 33 in the embodiment is formed. In addition, the first region 53 in which the resin portion 38 is in contact with the sealing plate 33 is formed between the second regions 54. That is, as illustrated in FIG. 19, the second region 54 is formed on the outer side of the first region 53, in the region in which the covered portion 51 of the sealing plate 33 is formed. The second region 54 in the embodiment (that is, interval 55) is formed also in the region in which the exposed portion 52 of the sealing plate 33 is formed, similarly to the above described first embodiment. In short, the second region 54 in the embodiment is formed approximately all over the extending direction of the resin portion 38, at both end portions of the resin portion 38 in the width direction. In addition, in the embodiment, the second region 54 is formed also in the both end portions of the resin portion 38 in the extending direction. That is, the second region 54 in the second embodiment is formed at the outer peripheral portion of the region in which the resin portion 38 is formed, as illustrated in FIG. 18. In other words, the second region 54 is formed at the periphery of the first region 53. In addition, since configurations other than that is the same as those in the above described first embodiment, descriptions thereof will be omitted.

In this manner, since the second region 54 is provided at the peripheral portion of the region in which the resin portion 38 including the exposed portion 52 is formed, it is possible to further prevent residue from remaining on the sealing plate 33, by etching the resin portion 38. In this manner, it is possible to suppress migration between conductive layers 39. In addition, since the conductive layer 39 and the resin portion 38 are separated, using the interval 55, on the surface of the sealing plate 33, it is possible to further suppress migration through the resin portion 38.

Subsequently, a forming method of the bump electrode 37 in the embodiment will be described in detail. FIGS. 20, 22, 24, and 26 are state transition diagrams of a section of the sealing plate 33 in a direction orthogonal to the extending direction of the resin portion 38 which describe the forming method of the bump electrode 37 in the embodiment. FIGS. 21, 23, 25, and 27 are state transition diagrams of a section of the sealing plate 33 in the extending direction of the resin portion 38 which describe the forming method of the bump electrode 37 in the embodiment.

Figure 22:
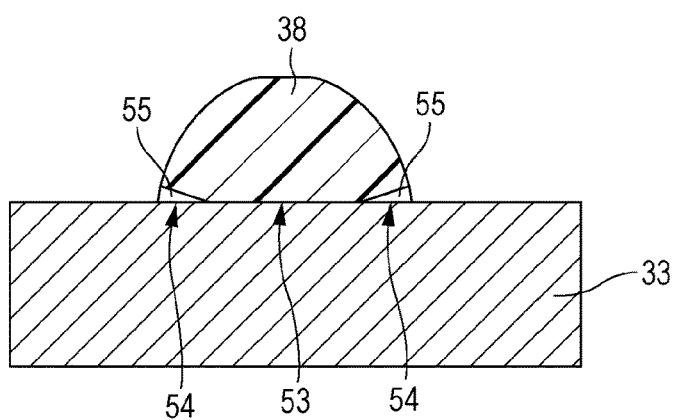
FIG. 22 is a state transition diagram of a section in the extending direction of the resin portion which describes a forming method of the bump electrode according to the second embodiment.
Figure 23:
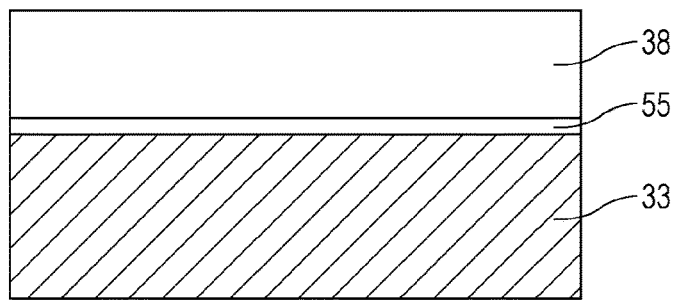
FIG. 23 is a state transition diagram of a section in the direction orthogonal to the extending direction of the resin portion which describes a forming method of the bump electrode according to the second embodiment.

First, similarly to the first embodiment, the resin portion 38 is formed on the surface of the sealing plate 33 on which the penetrating wiring 45 is formed, in a process of forming a resin portion (refer to FIGS. 20 and 21). Subsequently, the interval 55 is formed between the resin portion 38 and the sealing plate 33 at the outer peripheral portion of the resin portion 38, in a wet etching process. That is, the entire surface of the sealing plate 33 is bleached in an etching solution which can remove the resin portion 38, in the wet etching process. In this manner, as illustrated in FIGS. 22 and 23, the surface portion of the resin portion 38 is etched, and the external form of the resin portion 38 becomes slightly small. In addition, the etching solution proceeds toward the inside from the outer peripheral portion of the resin portion 38 on an interface between the resin portion 38 and the sealing plate 33. For this reason, the outer peripheral portion of a portion in the resin portion 38 located on the interface with the sealing plate 33 is etched, and the interval 55 is formed at the portion. As a result, the portion which is in contact with the sealing plate 33 remains at a center portion of the resin portion 38, and the interval 55 is formed at the peripheral portion of the resin portion 38. That is, the first region 53 is formed at the center portion of the region in which the resin portion 38 of the sealing plate 33 is formed, and the second region 54 is formed at the periphery of the first region 53.

Figure 24:
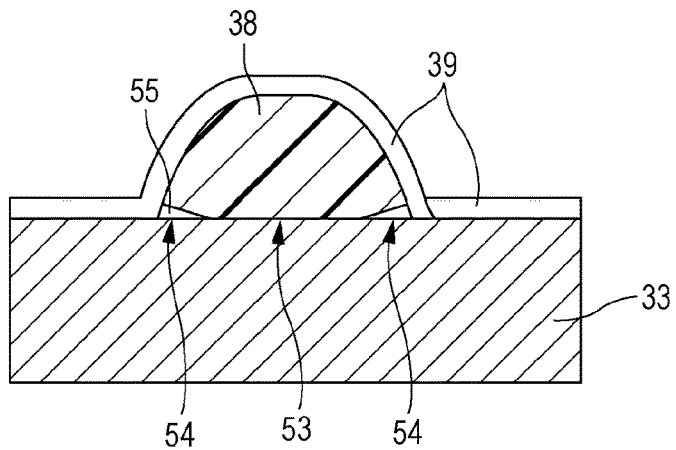
FIG. 24 is a state transition diagram of a section in the extending direction of the resin portion which describes a forming method of the bump electrode according to the second embodiment.
Figure 25:
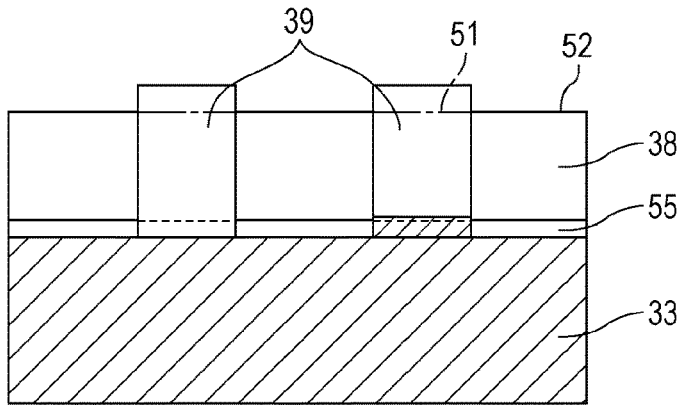
FIG. 25 is a state transition diagram of a section in the direction orthogonal to the extending direction of the resin portion which describes a forming method of the bump electrode according to the second embodiment.

Thereafter, the conductive layer 39 is formed on the resin portion 38 in the process of forming the conductive layer (corresponding to first electrode forming process in invention). Specifically, first, a metal layer is formed on the entire surface of the surface on the side on which the resin portion 38 of the sealing plate 33 is formed. At this time, also the surface of the resin portion 38 and an opening portion of the interval 55 are covered with the metal layer. Thereafter, a resist layer is formed on the metal layer, and the conductive layer 39 is formed at a predetermined position, through a photolithography process, an etching process, and the like. That is, as illustrated in FIGS. 24 and 25, the conductive layer 39 is formed on the surface of the sealing plate 33 and the surface of the resin portion 38. In this manner, the covered portion 51 covered with the conductive layer 39, and the exposed portion 52 which is not covered with the conductive layer 39 are formed in the resin portion 38. In addition, the interval 55 in the covered portion 51 enters a state of being covered with the conductive layer 39.

Figure 26:
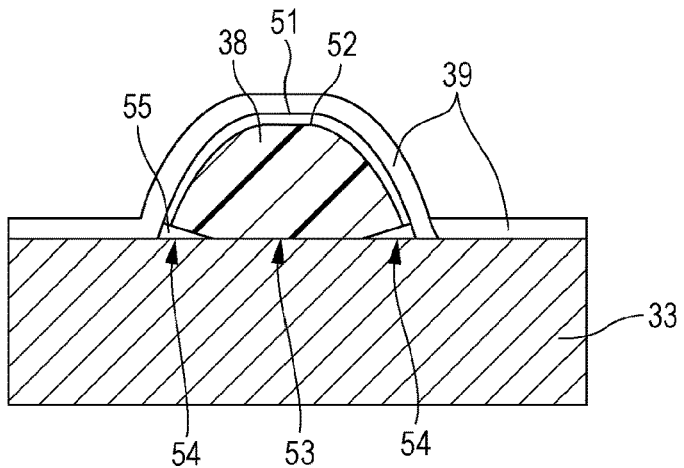
FIG. 26 is a state transition diagram of a section in the extending direction of the resin portion which describes a forming method of the bump electrode according to the second embodiment.
Figure 27:
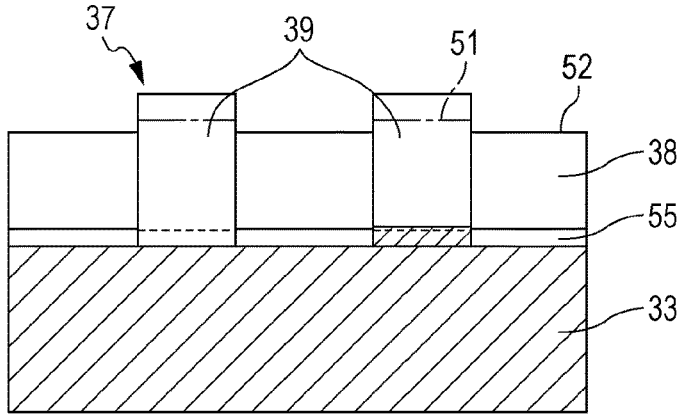
FIG. 27 is a state transition diagram of a section in the direction orthogonal to the extending direction of the resin portion which describes a forming method of the bump electrode according to the second embodiment.
Figure 28:
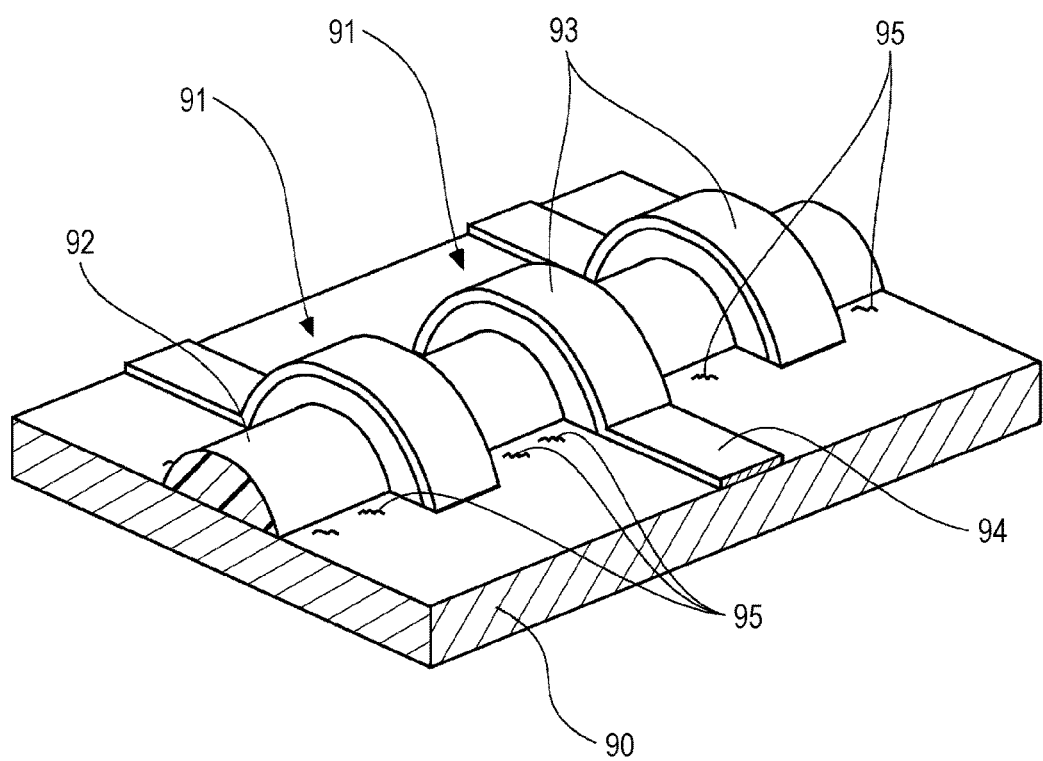
FIG. 28 is a perspective view which describes a configuration of a bump electrode in the related art.

When the conductive layer 39 is formed on the resin portion 38, the process proceeds to the dry etching process in which a part of the resin portion 38 is removed, using dry etching. In this manner, a part of the exposed portion 52 is etched, and the bump electrode 37 in the embodiment is formed on the sealing plate 33. Specifically, similarly to the first embodiment, dry etching is performed, by using the conductive layer 39 as a mask, and a part of the surface of the exposed portion 52 is removed. In this manner, as illustrated in FIGS. 26 and 27, the surface portion of the exposed portion 52 is further etched, and the external form of the exposed portion 52 becomes one size smaller than that of the covered portion 51. That is, a height of the exposed portion 52 from the surface of the sealing plate 33 becomes lower than that of the covered portion 51 from the surface of the sealing plate 33, and a width of the exposed portion 52 becomes smaller than that of the covered portion 51. Even when the exposed portion 52 is etched so as to be small in the width direction in this manner, since the resin portion 38 in the second region 54 of the sealing plate 33 is removed in advance in the above described wet etching process, it is possible to prevent residue from remaining on the sealing plate 33. In addition, even in a case in which there is a concern that the resin portion 38 may deteriorate due to dry etching, it is possible to prevent the deteriorated resin portion 38 from remaining as residue, since the resin portion 38 in the second region 54 of the sealing plate 33 is removed before the dry etching process. As a result, it is possible to suppress migration between the conductive layers 39 due to residue. In addition, since a manufacturing method of the recording head 3 thereafter is the same as that in the above described first embodiment, descriptions thereof will be omitted.

In the above descriptions, the bump electrode 37 which is connected to the individual terminal 41 has been mainly described, for the shape and the forming method of the bump electrode 37; however, since a bump electrode 37 connected to terminals other than that, such as the common terminal 42, has the same shape and forming method, descriptions thereof will be omitted. In addition, it is also possible to set the bump electrode 37 connected to the individual terminal and a bump electrode other than that to be in a different shape. The recording head 3 in which the driving IC 34 is provided on the sealing plate 33 has been exemplified, in each of the above described embodiments; however, it is not limited to this. For example, it is also possible to adopt a configuration in which the driving IC is not provided on the sealing plate, and a driving circuit is formed on the sealing plate itself. In addition, the bump electrode is formed on the sealing plate in each of the above described embodiments; however, it is not limited to this. For example, it is also possible to adopt a configuration in which a bump electrode is formed on the pressure chamber forming substrate, and the bump electrode is in contact with a terminal on the sealing plate side. In this case, a top face (that is, face on sealing plate side) of the pressure chamber forming substrate corresponds to the one face in the invention.

In the above descriptions, the ink jet recording head 3 has been exemplified as the liquid ejecting head; however, the invention can be applied to a liquid ejecting head other than that. For example, it is also possible to apply the invention to a coloring material ejecting head which is used when manufacturing a color filter of a liquid ejecting apparatus, and the like, an electrode material ejecting head which is used when forming an electrode of an organic electroluminescence (EL) display, a surface emission display (FED), and the like, a bioorganic material ejecting head which is used when manufacturing a biochip (biochemical element), and the like. In the coloring material ejecting head for the display manufacturing device, a solution of each coloring material of R (red), G (green), and B (blue) is ejected as a type of liquid. In addition, a liquid electrode material is ejected from the electrode material ejecting head for the electrode forming device as a type of liquid, and a solution of a bioorganic material is ejected from the organic material ejecting head for a chip manufacturing device as a type of liquid.

In the above descriptions, a joint structure which configures the actuator unit 14 of the recording head 3 has been exemplified as the joint structure related to the invention; however, it is not limited to this. It is possible to apply the invention when it is a joint structure in which a resin portion which protrudes from one face, a first substrate in which a conductive layer which covers the surface of the resin portion, and a second substrate in which a second electrode corresponding to a first electrode are joined. It is possible to apply the invention to a piezoelectric device provided with such a joint structure. For example, it is also possible to apply the invention to a sensor, and the like, which is provided with a piezoelectric element in a driving region, and detects a pressure change, vibration, displacement, or the like, of the driving region.

The entire disclosure of Japanese Patent Application No. 2016-168865, filed Aug. 31, 2016 is expressly incorporated by reference herein.

What is claimed is:

1. A joint structure comprising:
   a first substrate on which a resin portion which protrudes from one face and is formed of a resin, and a plurality of first electrodes which cover a part of the surface on the side opposite to the one face of the resin portion, are formed; and
   a second substrate on which a plurality of the second electrodes corresponding to the plurality of first electrodes are formed on the face which faces the one face,
   wherein the first substrate and the second substrate are joined in a state in which the first electrode and the second electrode corresponding to each other are electrically connected,
   wherein a region in which the resin portion is disposed on the one face of the first substrate includes a first region in which the resin portion is in contact with the one face, and a second region in which the resin portion is separated from the one face, and
   wherein the second region is formed on the outer side of the first region in the one face.

2. The joint structure according to claim 1,
   wherein the resin portion includes a first portion which is covered with the first electrode, and a second portion adjacent to the first potion, and
   wherein a height of the first portion from the one face is higher than a height of the second portion from the one face.

3. The joint structure according to claim 1,
   wherein the resin portion includes the first portion covered with the first electrode, and the second portion adjacent to the first portion, and
   wherein a distance between the first portion and the second electrode is shorter than a distance between the second portion and the second electrode in a direction intersecting the one face.

4. The joint structure according to claim 1,
   wherein the second region is formed in a region corresponding to a portion between the two first electrodes.

5. The joint structure according to claim 1,
   wherein the second region is formed at the periphery of the first region.

6. A piezoelectric device comprising:
   the joint structure according to claim 1; and
   a piezoelectric element stacked on any one of a first substrate and a second substrate.

7. A liquid ejecting head comprising:
   the piezoelectric device according to claim 6; and
   nozzles from which liquid is ejected when the piezoelectric element is driven.

8. A liquid ejecting apparatus comprising:
   the liquid ejecting head according to claim 7.

* * * * *